(12) United States Patent
Jin et al.

(10) Patent No.: US 10,020,341 B2
(45) Date of Patent: Jul. 10, 2018

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Yong Wan Jin, Seoul (KR); Kyu Sik Kim, Yongin-si (KR); Kyung Bae Park, Hwaseong-si (KR); Kwang Hee Lee, Yongin-si (KR); Dong-Seok Leem, Hwaseong-si (KR); Deukseok Chung, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/673,906

(22) Filed: Aug. 10, 2017

(65) Prior Publication Data

US 2017/0338271 A1    Nov. 23, 2017

Related U.S. Application Data

(63) Continuation of application No. 15/143,909, filed on May 2, 2016, now Pat. No. 9,761,627, which is a (Continued)

(30) Foreign Application Priority Data

Jan. 15, 2014 (KR) .................. 10-2014-0005310
Jul. 31, 2014 (KR) .................. 10-2014-0098567

(51) Int. Cl.
*H01L 27/146* (2006.01)

(52) U.S. Cl.
CPC .. *H01L 27/14645* (2013.01); *H01L 27/14621* (2013.01); *H01L 27/14625* (2013.01); (Continued)

(58) Field of Classification Search
CPC ..................................... H01L 27/146
See application file for complete search history.

(56) References Cited

U.S. PATENT DOCUMENTS

| 6,295,130 | B1 | 9/2001 | Sun et al. |
| 7,129,466 | B2 | 10/2006 | Iwasaki |

(Continued)

FOREIGN PATENT DOCUMENTS

| JP | 2003142709 A | 5/2003 |
| JP | 2011151421 A | 8/2011 |

(Continued)

OTHER PUBLICATIONS

Cha, Bo Kyung, et al., "High-Resolution X-Ray Imaging Based on Pixel-Structured Csi:TI Scintillating Screens for Indirect X-Ray Image Sensors," Journal of the Korean Physical Society. vol. 59. Issue 6. Special Issue: SI. p. 3670-3673.

(Continued)

*Primary Examiner* — Marc Armand
(74) *Attorney, Agent, or Firm* — Harness, Dickey & Pierce, P.L.C.

(57) ABSTRACT

An image sensor includes a semiconductor substrate integrated with at least one first photo-sensing device configured to sense light in a blue wavelength region and at least one second photo-sensing device configured to sense light in a red wavelength region, a color filter layer on the semiconductor substrate and including a blue color filter configured to selectively absorb light in a blue wavelength region and a red color filter configured to selectively absorb light in a red wavelength region, and a third photo-sensing device on the color filter layer and including a pair of electrodes facing each other, and a photoactive layer between the pair of electrodes and configured to selectively absorb light in a green wavelength region.

21 Claims, 7 Drawing Sheets

Related U.S. Application Data continuation of application No. 14/560,920, filed on Dec. 4, 2014, now Pat. No. 9,362,327.

(52) U.S. Cl.
CPC .. *H01L 27/14627* (2013.01); *H01L 27/14629* (2013.01); *H01L 27/14636* (2013.01)

(56) References Cited

U.S. PATENT DOCUMENTS

| | | |
|---|---|---|
| 7,626,627 B2 | 12/2009 | Suzuki |
| 7,897,426 B2 | 3/2011 | Maehara |
| 7,920,189 B2 | 4/2011 | Goto |
| 7,932,574 B2 | 4/2011 | Kanbe |
| 8,035,708 B2 | 10/2011 | Takizawa et al. |
| 2008/0230123 A1 | 9/2008 | Mitsui et al. |
| 2010/0123070 A1 | 5/2010 | Natori |
| 2010/0201834 A1 | 8/2010 | Maruyama et al. |
| 2010/0243868 A1 | 9/2010 | Liu et al. |
| 2012/0249829 A1* | 10/2012 | Izuha ............... H01L 27/14621 348/229.1 |
| 2014/0070189 A1 | 3/2014 | Leem et al. |

FOREIGN PATENT DOCUMENTS

| | | |
|---|---|---|
| JP | 2011258729 A | 12/2011 |
| KR | 20040095182 A | 11/2004 |
| KR | 20140034693 A | 3/2014 |

OTHER PUBLICATIONS

Ariyoshi, Tetsuya, et al., "Improved Near-Infared Sensitivity of a Back-Side Illuminated Image Sensor With a Metal Reflector," IEICE Electronics Express. vol. 6. Issue 6. p. 341-346.

* cited by examiner

IMAGE SENSOR AND ELECTRONIC DEVICE INCLUDING THE SAME

CROSS REFERENCE TO RELATED APPLICATIONS

This application is a continuation of U.S. application Ser. No. 15/143,909, filed on May 2, 2016, which is a continuation of U.S. application Ser. No. 14/560,920, filed on Dec. 4, 2014, which claims priority under 35 U.S.C. § 119 to the benefit of Korean Patent Application No. 10-2014-0005310 filed in the Korean Intellectual Property Office on Jan. 15, 2014, and Korean Patent Application No. 10-2014-0098567 filed in the Korean Intellectual Property Office on Jul. 31, 2014, the entire contents of each of which are incorporated herein by reference.

BACKGROUND

1. Field

Example embodiments are directed to an image sensor and an electronic device including the same.

2. Description of the Related Art

A photoelectric device converts light into an electrical signal using photoelectric effects, and may include a photodiode and/or a phototransistor, and may be applied to an image sensor and/or a solar cell.

An image sensor including a photodiode requires relatively high resolution and thus a relatively small pixel. However, at present, a silicon photodiode is widely used, but it may have a problem of deteriorated sensitivity because the silicon photodiode has a relatively small absorption area due to relatively small pixels.

SUMMARY

Example embodiments provide an image sensor that is desirable for being down-sized and is capable of decreasing sensitivity deterioration while having a high resolution.

Example embodiments also provide an electronic device including the image sensor.

According to example embodiments, an image sensor includes a semiconductor substrate integrated with at least one first photo-sensing device configured to sense light in a blue wavelength region and at least one second photo-sensing device configured to sense light in a red wavelength region, a color filter layer on the semiconductor substrate and including a blue color filter configured to selectively absorb light in a blue wavelength region and a red color filter configured to selectively absorb light in a red wavelength region, and a third photo-sensing device on the color filter layer and including a pair of electrodes facing each other, and a photoactive layer between the pair of electrodes and configured to selectively absorb light in a green wavelength region.

The blue wavelength region may have a maximum absorption wavelength ($\lambda_{max}$) in a region of greater than or equal to about 400 nm and less than about 500 nm, the red wavelength region may have a maximum absorption wavelength ($\lambda_{max}$) in a region of greater than about 580 nm and less than or equal to about 700 nm, and the green wavelength region may have a maximum absorption wavelength ($\lambda_{max}$) in a region of about 500 nm to about 580 nm.

The pair of electrodes may be light-transmitting electrodes, and the photoactive layer includes a p-type semiconductor material and an n-type semiconductor material, at least one of the p-type semiconductor material and the n-type semiconductor material configured to selectively absorb light in the green wavelength region.

The image sensor may further include a focusing lens on the third photo-sensing device.

The image sensor may further include a metal wire beneath the at least one first photo-sensing device and the at least one second photo-sensing device.

The image sensor may further include a semi-transmitting layer between the third photo-sensing device and the color filter layer.

The semi-transmitting layer may be configured to transmit light in the blue wavelength region and the red wavelength region and may be configured to selectively reflect light in the green wavelength region.

The semi-transmitting layer may include a plurality of first and second layers alternately stacked on the semiconductor substrate, the plurality of first layers having different refractive indices from the plurality of second layers.

The thickness of each of the plurality of first and second layers may be determined by the refractive indices and reflective wavelengths of the plurality of first and second layers.

A full width at half maximum of the green wavelength region in a light-absorption spectrum may be determined by a ratio of the refractive indices of the plurality of first and second layers.

The plurality of first layers may have the refractive index of about 1.2 to about 1.8, and the plurality of second layers may have the refractive index of about 2.1 to about 2.7.

Each of the plurality of first layers may be a silicon oxide layer, and each of the plurality of second layers may be a titanium oxide layer. The semi-transmitting layer may include a plurality of silicon oxide layers and a plurality of titanium oxide layers alternately stacked on the semiconductor substrate to form 5 to 10 layers, and each of the plurality of silicon oxide layers may have a thickness of about 10 nm to 300 nm, and each of the plurality of titanium oxide layers has a thickness of about 30 nm to 200 nm.

According to example embodiments, an electronic device includes the image sensor.

DETAILED DESCRIPTION

Figure 1:
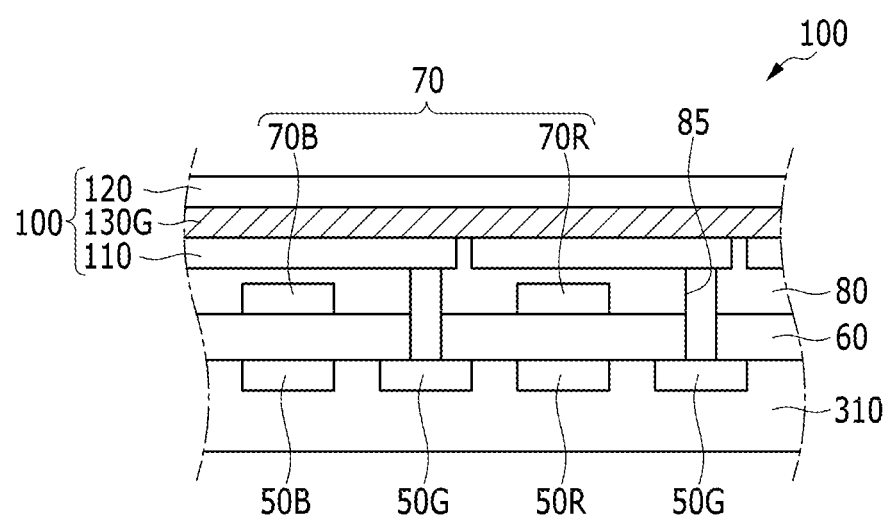
FIG. 1 is a cross-sectional view showing a CMOS image sensor according to example embodiments.

Example embodiments will hereinafter be described in detail, and may be easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring to drawings, an image sensor according to example embodiments is described. Herein, a CMOS image sensor as an example of an image sensor is described.

FIG. 1 is a cross-sectional view showing a CMOS image sensor according to example embodiments.

An image sensor according to example embodiments includes a first pixel, a second pixel, and a third pixel that are adjacent to one another. The first pixel, second pixel, and third pixel may have different absorption wavelength regions in a visible ray region, for example, about 380 to 780 nm, and for example the first pixel may be a blue pixel sensing light in a blue wavelength region, the second pixel may be a red pixel sensing light in a red wavelength region, and the third pixel may be a green pixel sensing light in a green wavelength region.

The blue wavelength region may have a maximum absorption wavelength ($\lambda_{max}$) in a region of greater than or equal to about 400 nm and less than about 500 nm, the red wavelength region may have a maximum absorption wavelength ($\lambda_{max}$) in a region of greater than about 580 nm and less than or equal to about 700 nm, and the green wavelength region may have a maximum absorption wavelength ($\lambda_{max}$) in a region of about 500 nm to about 580 nm.

The blue, red, and green pixels may be repeatedly arranged as one group along a row and/or column. However, the pixel disposition may be variously modified.

Referring to FIG. 1, an image sensor 300 according to example embodiments includes a semiconductor substrate 310 integrated with a blue photo-sensing device 50B, a red photo-sensing device 50R, a charge storage device 50G, and a transmission transistor (not shown), a lower insulation layer 60, a color filter layer 70, an upper insulation layer 80, and a green photo-sensing device 100.

In FIG. 1, a constituent element including "B" in the reference symbol refers to a constituent element included in the blue pixel, a constituent element including "R" in the reference symbol refers to a constituent element included in the red pixel, and a constituent element including "G" in the reference symbol refers to a constituent element included in the green pixel.

The semiconductor substrate 310 may be a silicon substrate, and the blue photo-sensing device 50B, the red photo-sensing device 50R, the charge storage device 50G, and transmission transistor (not shown) are integrated therein. The blue photo-sensing device 50B and red photo-sensing device 50R may be photodiodes. The blue photo-sensing device 50B and the transmission transistor may be integrated in each blue pixel, the red photo-sensing device 50R and the transmission transistor may be integrated in each red pixel, and the charge storage device 50G and the transmission transistor may be integrated in each green pixel.

Metal wires (not shown) and pads (not shown) are formed on the semiconductor substrate 310. In order to decrease signal delay, the metal wires and pads may be made of a metal having relatively low resistivity, for example, aluminum (Al), copper (Cu), silver (Ag), and alloys thereof, but are not limited thereto.

The lower insulation layer 60 may be formed on the metal wire and pad. The lower insulation layer 60 may be, for example, made of an inorganic insulation material (e.g., a silicon oxide and/or a silicon nitride), or a low dielectric constant (low K) material (e.g., SiC, SiCOH, SiCO, and SiOF).

The lower insulation layer 60 may have trenches (not shown) exposing photo-sensing devices 50B and 50R and the charge storage device 50G of each pixel. The trench may be filed with a filler.

The color filter layer 70 is formed on the lower insulation layer 60. The color filter layer 70 includes a blue color filter 70B of a blue pixel and a red color filter 70R of a red pixel. The blue color filter 70B may absorb light in a blue wavelength region and transmits it to the blue photo-sensing device 50B, and the red color filter 70R may absorb light in a red wavelength region and transmits it to the red photo-sensing device 50R. The green pixel does not include a color filter.

The upper insulation layer 80 is formed on the color filter layer 70. The upper insulation layer 80 may reduce the steps necessary due to the color filter layer 70, and make it be planarized. The upper insulation layer 80 and lower insulation layer 60 have a contact hole (not shown) exposing the pad, and a through-hole 85 exposing the charge storage device 50G of the green pixel.

The green photo-sensing device 100 is formed on the upper insulation layer 80. The green photo-sensing device 100 includes a lower electrode 110 and an upper electrode 120 facing each other, and a photoactive layer 130G interposed between the lower electrode 110 and the upper electrode 120. One of the lower electrode 110 and the upper electrode 120 is an anode and the other is a cathode.

The lower electrode 110 and the upper electrode 120 may be light-transmitting electrodes, and the light-transmitting electrodes may be made of, for example, a transparent conductor (e.g., indium tin oxide (ITO) or indium zinc oxide (IZO)), or may be a metal thin layer having a relatively thin thickness of several nanometers or several tens of nanometers or a metal thin layer having a relatively thin thickness of several nanometers to several tens of nanometers doped with a metal oxide.

The photoactive layer 130G may selectively absorb light in a green wavelength region, and transmit light in other wavelength region besides the green wavelength region, that is, light in a blue wavelength region and a red wavelength region.

The photoactive layer 130G may include a p-type semiconductor material and an n-type semiconductor material, and the p-type semiconductor material and the n-type semiconductor material may form a pn junction. At least one of the p-type material and the n-type material may selectively absorb light in a green wavelength region, and for example the p-type material and the n-type material may selectively absorb light in a green wavelength region. The photoactive layer 130G may selectively absorb light in a green wavelength region to generate excitons, and then the generated excitons may be separated into holes and electrons to provide a photoelectric effect. The photoactive layer 130G may replace a color filter of a green pixel.

Each of the p-type semiconductor material and the n-type semiconductor material may have an energy bandgap of, for example, about 2.0 to about 2.5 eV, and the p-type semiconductor material and the n-type semiconductor material may have a LUMO difference of, for example, about 0.2 to about 0.7 eV.

The p-type semiconductor material may be, for example, quinacridone or a derivative thereof, and the n-type semiconductor material may be, for example, a cyanovinyl group-containing thiophene derivative, but they are not limited thereto.

The quinacridone or derivative thereof may be, for example, represented by the following Chemical Formula 1.

[Chemical Formula 1]

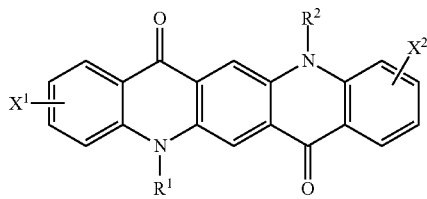

In the Chemical Formula 1, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, each of $X^1$ and $X^2$ are independently one of hydrogen, a substituted or unsubstituted $C_1$ to $C_{30}$ alkyl group, a substituted or unsubstituted $C_2$ to $C_{30}$ alkenyl group, a substituted or unsubstituted $C_6$ to $C_{30}$ aromatic group, a substituted or unsubstituted $C_3$ to $C_{30}$ heterocyclic aromatic group, a cyano-containing group, a halogen-containing group, and a combination thereof.

The quinacridone or derivatives thereof may be represented by, for example, the following Chemical Formulae 1a to 1o, but are not limited thereto.

[Chemical Formula 1a]

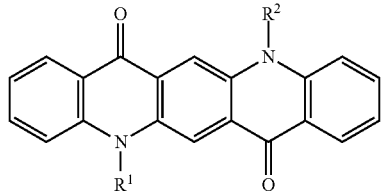

[Chemical Formula 1b]

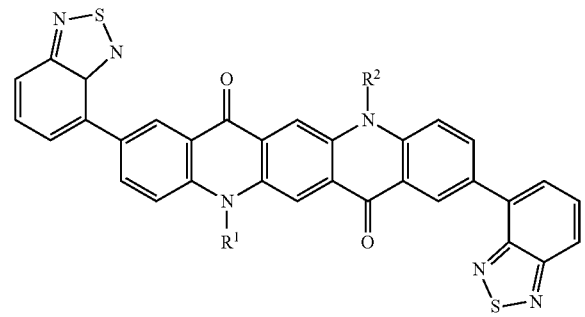

[Chemical Formula 1c]

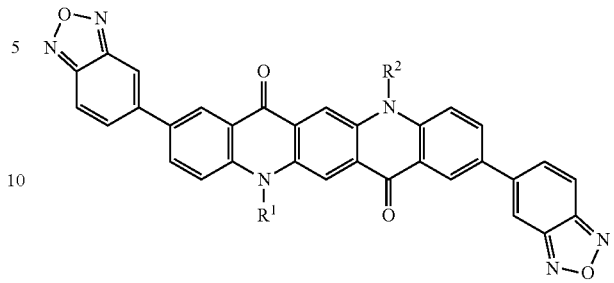

[Chemical Formula 1d]

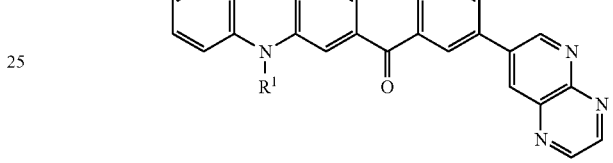

[Chemical Formula 1e]

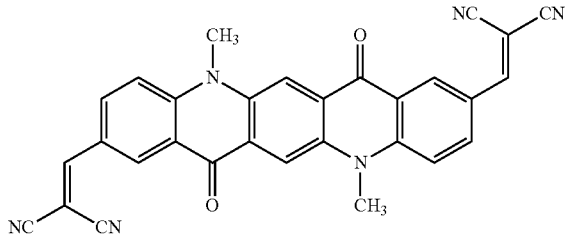

[Chemical Formula 1f]

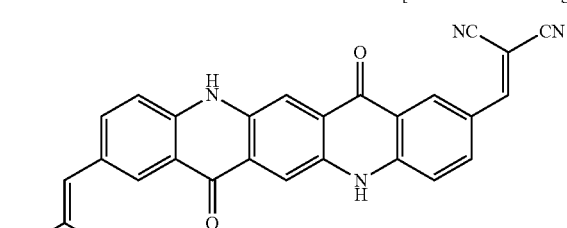

[Chemical Formula 1g]

[Chemical Formula 1h]

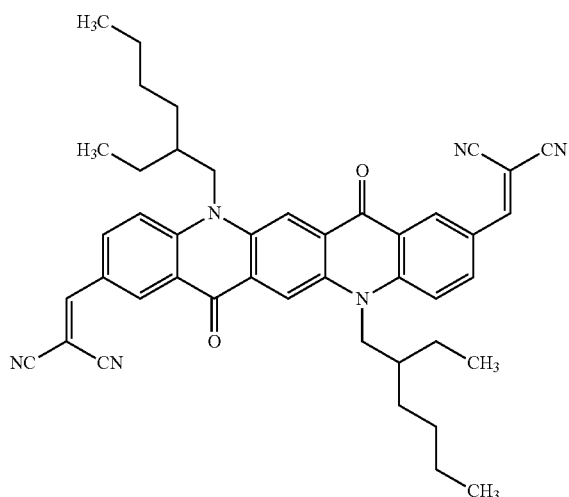

[Chemical Formula 1i]

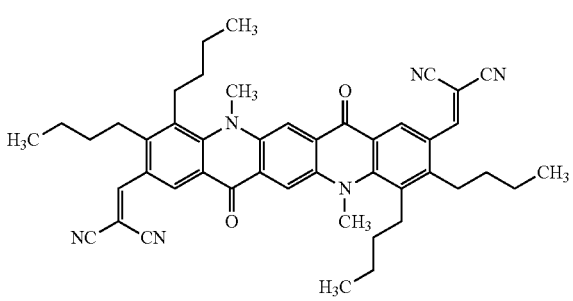

[Chemical Formula 1j]

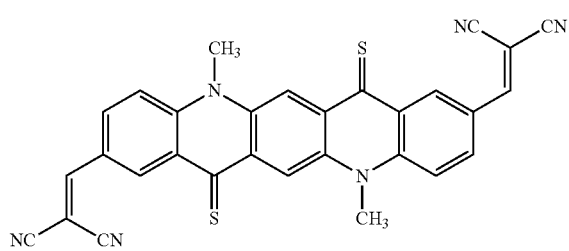

[Chemical Formula 1k]

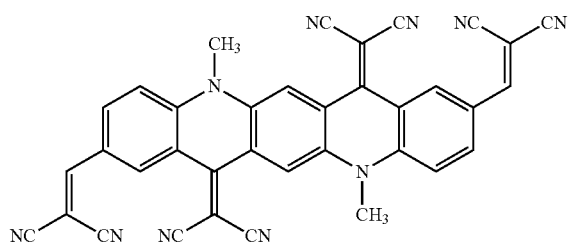

[Chemical Formula 1l]

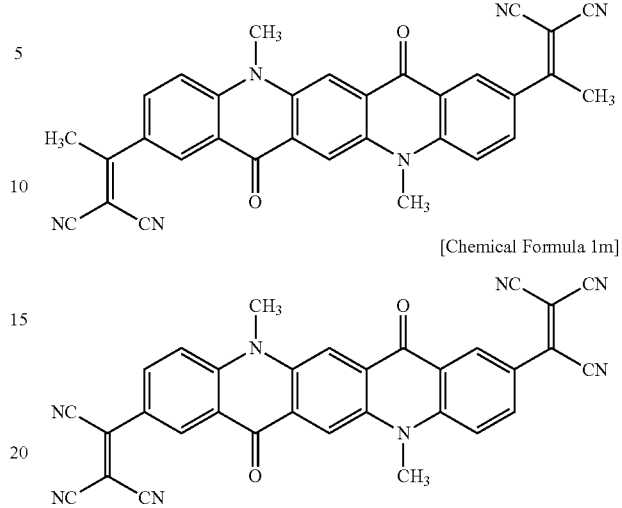

[Chemical Formula 1m]

[Chemical Formula 1n]

[Chemical Formula 1o]

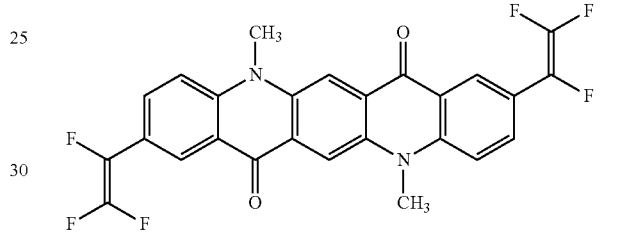

In the Chemical Formulae 1a to 1o, $R^1$ and $R^2$ are the same as described above.

The thiophene derivative may be represented by, for example, the following Chemical Formula 2.

[Chemical Formula 2]

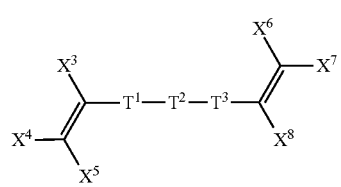

In the Chemical Formula 2, each of $T^1$, $T^2$, and $T^3$ are independently an aromatic ring having a substituted or unsubstituted thiophene moiety, and each of $X^3$ to $X^8$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ or $C_{30}$ heteroaryl group, a cyano group, and a combination thereof. At least one of $X^3$ to $X^8$ may be a cyano group.

The $T^1$, $T^2$, and $T^3$ may be independently selected from groups listed in the following Group 1.

[Group 1]

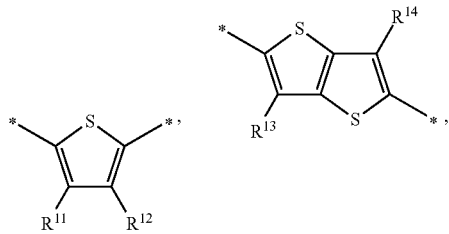

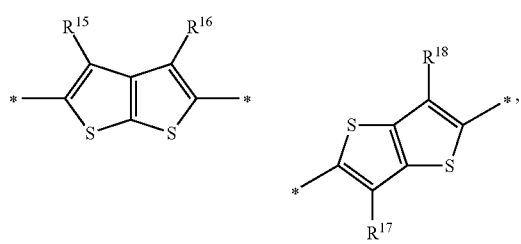

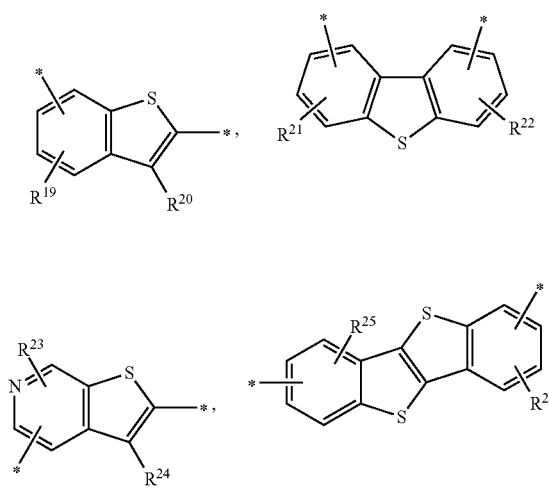

In the Group 1, each of $R^{11}$ to $R^{26}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The thiophene derivative may be, for example, selected from a compound represented by the following Chemical Formulae 2a to 2j, but is not limited thereto.

[Chemical Formula 2a]

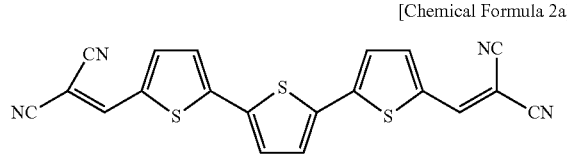

[Chemical Formula 2b]

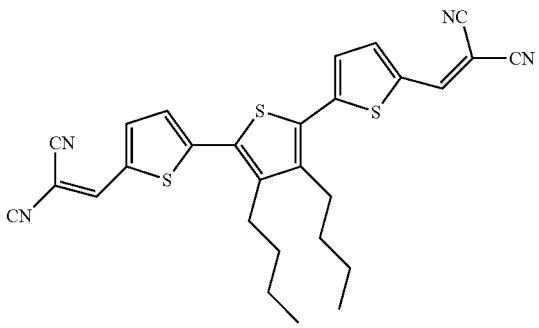

[Chemical Formula 2c]

[Chemical Formula 2d]

[Chemical Formula 2e]

[Chemical Formula 2f]

[Chemical Formula 2g]

[Chemical Formula 2h]

[Chemical Formula 2i]

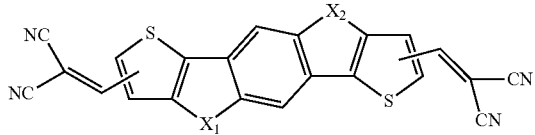

[Chemical Formula 2j]

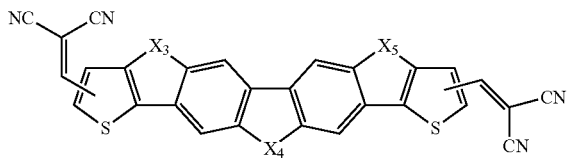

In the above Chemical Formulae 2h or 2j, each of $X_1$ to $X_5$ are the same or different and are independently one of $CR^1R^2$, $SiR^3R^4$, $NR^5$, oxygen (O), and selenium (Se), wherein each of $R^1$ to $R^5$ are the same or different and are independently one of hydrogen, a substituted or unsubstituted C1 to C20 alkyl group, a substituted or unsubstituted C6 to C20 aryl group, a substituted or unsubstituted C3 to C20 heteroaryl group, and a combination thereof.

The p-type semiconductor material may be, for example a compound represented by the Chemical Formula 3, and the n-type semiconductor material may be, for example, a compound represented by the Chemical Formula 4, but they are not limited thereto.

[Chemical Formula 3]

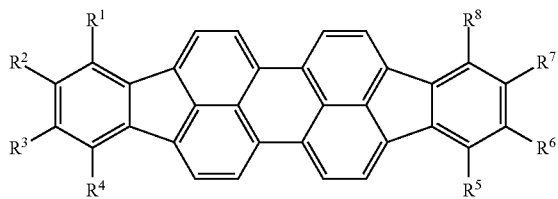

In the Chemical Formula 3, each of $R^1$ to $R^8$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof, wherein two adjacent groups of $R^1$ to $R^8$ may be bonded together to form a ring or a fused ring, and at least one of $R^1$ to $R^8$ is one of a substituted or unsubstituted $C_6$ to $C_{30}$ aryl group, a substituted or unsubstituted $C_3$ to $C_{30}$ heteroaryl group, and a combination thereof.

[Chemical Formula 4]

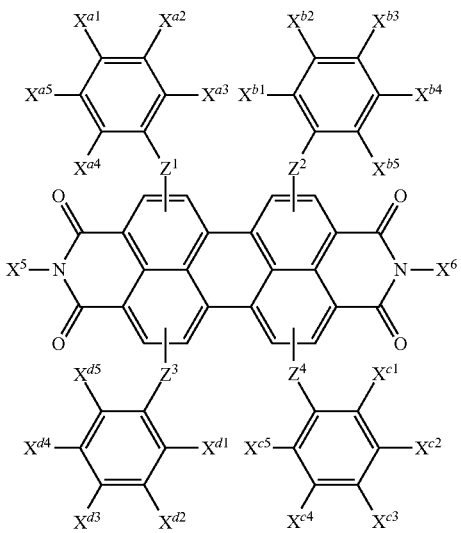

In the Chemical Formula 4, each of $Z^1$ to $Z^4$ are independently one of oxygen (O), nitrogen (N), and sulfur (S), each of $X^{a1}$ to $X^{a5}$, $X^{b1}$ to $X^{b5}$, $X^{c1}$ to $X^{c5}$, and $X^{d1}$ to $X^{d5}$ are independently one of hydrogen, a substituted or unsubstituted $C_1$ to $C_{30}$ alkyl group, a substituted or unsubstituted $C_6$ to $C_{30}$ aryl group, a halogen atom, a halogen-containing group, and a combination thereof, and each of $X^5$ and $X^6$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The compound represented by the Chemical Formula 3 may be, for example, a compound represented by one of the Chemical Formulae 3a to 3d, and the compound represented by the Chemical Formula 4 may be, for example, a compound represented by the Chemical Formula 4a or 4b, but they are not limited thereto.

[Chemical Formula 3a]

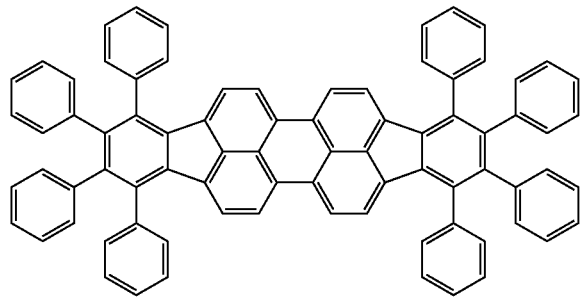

[Chemical Formula 3b]

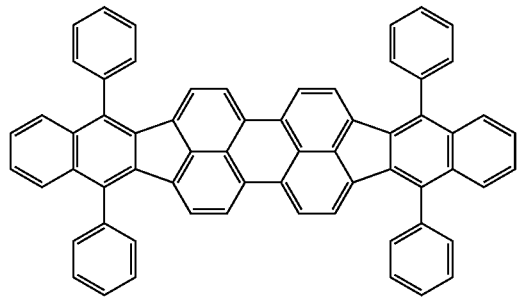

[Chemical Formula 3c]
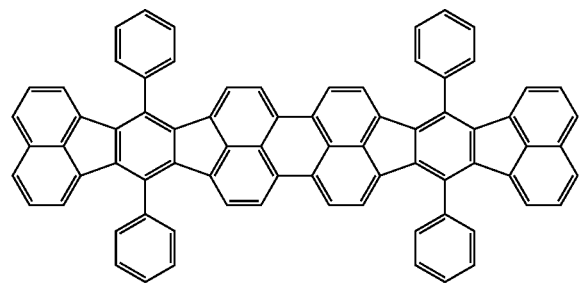
[Chemical Formula 3d]
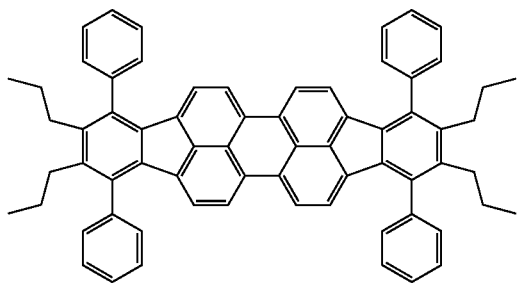
[Chemical Formula 4a]
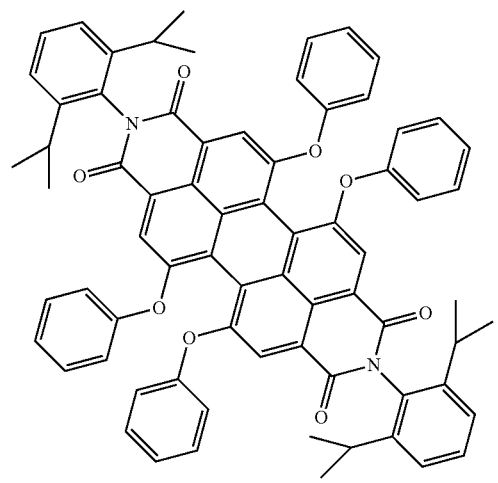
[Chemical Formula 4b]
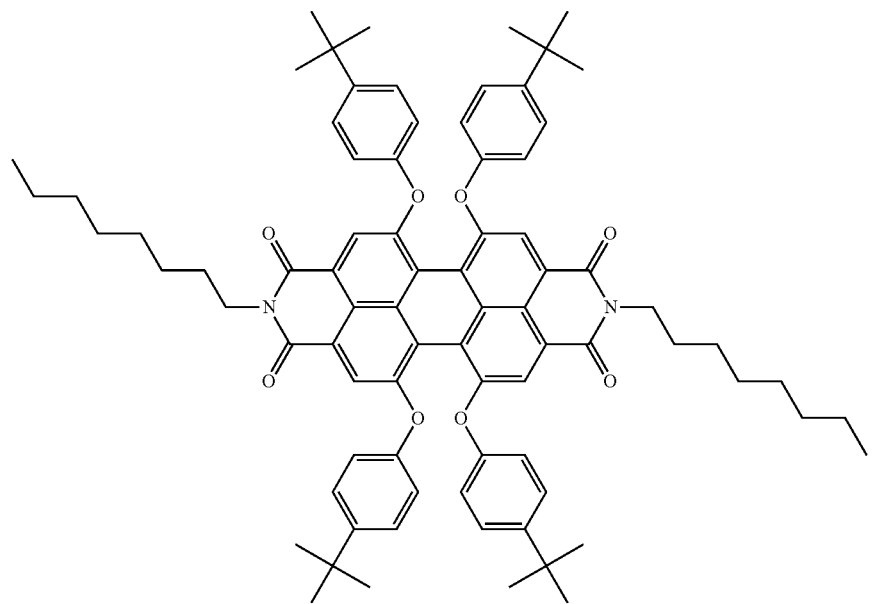

The p-type semiconductor material may be, for example, the above quinacridone or derivatives thereof, and the n-type semiconductor material may be, for example, a compound represented by the following Chemical Formula 5, but they are not limited thereto.

[Chemical Formula 5]

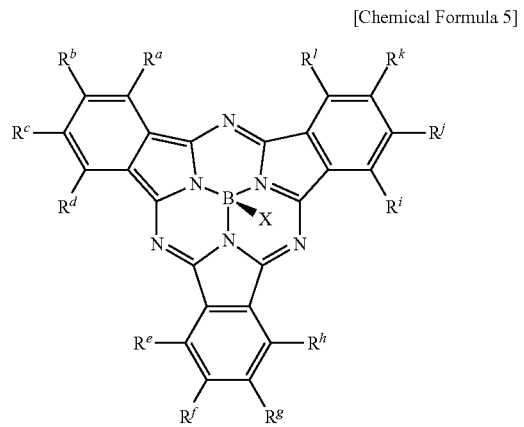

In the Chemical Formula 5, each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is one of a halogen atom and a $C_6$ to $C_{20}$ aryloxy group including at least one halogen atom.

The compound represented by the Chemical Formula 5 may be, for example at least one of compounds represented by the following Chemical Formulae 5a to 5g, but is not limited thereto.

[Chemical Formula 5a]

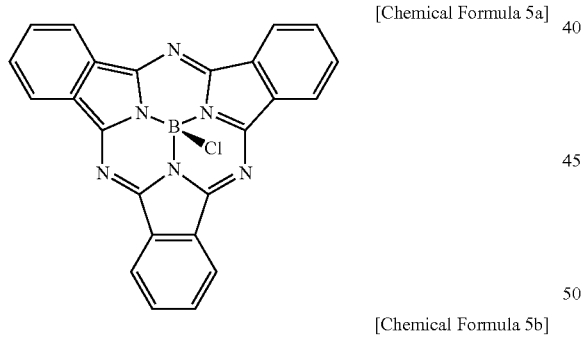

[Chemical Formula 5b]

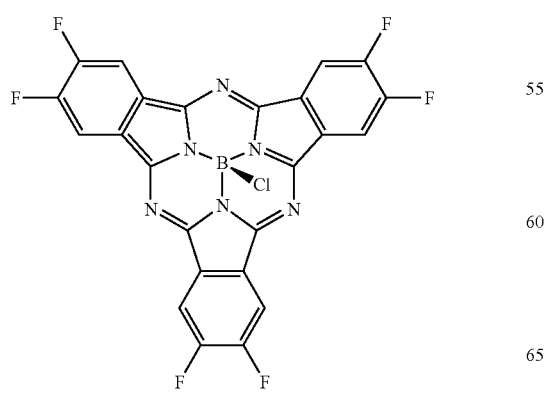

[Chemical Formula 5c]

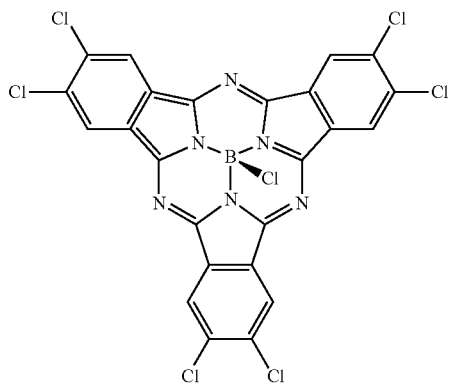

[Chemical Formula 5d]

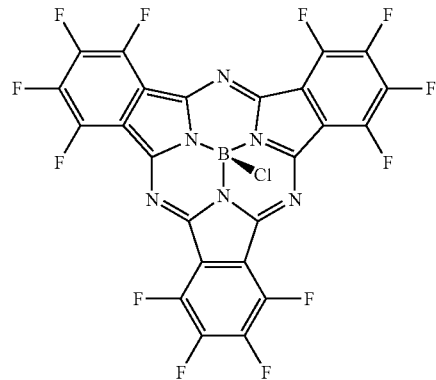

[Chemical Formula 5e]

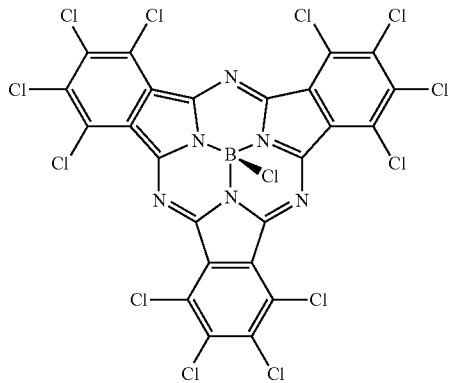

[Chemical Formula 5f]

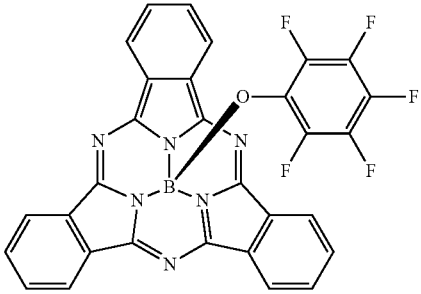

[Chemical Formula 5g]

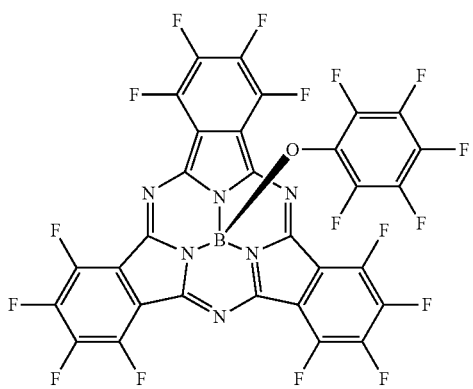

The photoactive layer 130G may be a single layer or a multilayer. The photoactive layer 130G may be, for example, an intrinsic layer (I layer), a p-type layer/I layer, an I layer/n-type layer, a p-type layer/I layer/n-type layer, and/or a p-type layer/n-type layer.

The intrinsic layer (I layer) may include the p-type semiconductor material and the n-type semiconductor material in a thickness ratio of about 1:100 to about 100:1. The materials may be included in a thickness ratio ranging from about 1:50 to about 50:1 within the range, for example, about 1:10 to about 10:1, or about 1 to about 1. When the p-type and n-type semiconductor materials have a composition ratio within the range, an exciton may be effectively produced, and a pn junction may be effectively formed.

The p-type layer may include the p-type semiconductor material, and the n-type layer may include the n-type semiconductor material.

The photoactive layer 130G may have a thickness of about 1 nm to about 500 nm. Within the range, the photoactive layer 130G may have a thickness of about 5 nm to about 300 nm. When the photoactive layer 130G has a thickness within the range, the photoactive layer may effectively absorb light, effectively separate holes from electrons, and deliver them, effectively improving photoelectric conversion efficiency.

In the green photo-sensing device 100, when light is incident from the upper electrode 120 and then the photoactive layer 130G absorbs light in a green wavelength region, excitons may be produced from the inside. The excitons are separated into holes and electrons in the photoactive layer 130G, and the separated holes are transported to an anode that is one of the lower electrode 110 and the upper electrode 120, and the separated electrons are transported to the cathode that is the other of the lower electrode 110 and the upper electrode 120 so as to flow a current. The separated electrons or holes may be gathered in the charge storage device 50G. Light in other wavelength regions except for a green wavelength region pass the lower electrode 110 and color filters 70B and 70G and may be sensed by the blue photo-sensing device 50B or the red photo-sensing device 50R.

The photoactive layer 130G may be formed on the front of the image sensor 300 and absorb light thereon, and thus increase a photo area and bring about high absorption efficiency.

On the green photo-sensing device 100, a focusing lens (not shown) may be further formed. The focusing lens may control direction of incident light and gather the light in one region. The focusing lens may have a shape of, for example, a cylinder or a hemisphere, but is not limited thereto.

In this way, a color filter layer including a color filter absorbing light in blue and red wavelength regions in visible rays and a green photo-sensing device absorbing light in a green wavelength region are vertically stacked, and thus may decrease an area of an image sensor and down-size the image sensor.

In addition, a photo-sensing device selectively absorbing light in a green wavelength region is formed on the front of the image sensor, and thus may increase its area absorbing light and secure an area of the color filter layer and increase absorption efficiency.

Figure 2:
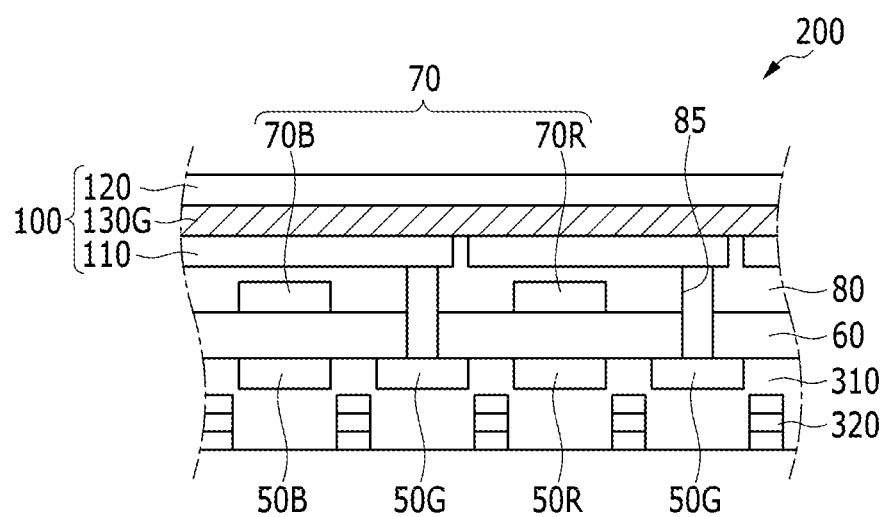
FIG. 2 is a cross-sectional view showing a CMOS image sensor according to example embodiments.

FIG. 2 is a cross-sectional view showing an organic photoelectronic device according to example embodiments.

Referring to FIG. 2, a CMOS image sensor 200 according to example embodiments includes a semiconductor substrate 310 integrated with a blue photo-sensing device 50B, a red photo-sensing device 50R, a charge storage device 50G, and a transmission transistor (not shown), a lower insulation layer 60, a color filter layer 70, an upper insulation layer 80, and a green photo-sensing device 100, like example embodiments as illustrated in FIG. 1.

The color filter layer 70 includes a blue color filter 70B of a blue pixel and a red color filter 70R of a red pixel, and the green photo-sensing device 100 includes a lower electrode 110, a photoactive layer 130G, and an upper electrode 120. The photoactive layer 130G may selectively absorb light in a green wavelength region and transmit light in other wavelength region besides the green wavelength region, that is, light in a blue wavelength region and a red wavelength region, as described above.

However, a metal wire 320 is positioned beneath the blue photo-sensing device 50B, the red photo-sensing device 50R, and the charge storage device 50G, unlike the example embodiments illustrated in FIG. 1. When the metal wire 320 is positioned beneath the blue photo-sensing device 50B, the red photo-sensing device 50R, and the charge storage device 50G, light loss due to reflection of the metal wire 320 made of an opaque metal decreases, light efficiency increases, and light interference among pixels may be effectively reduced.

Figure 3:
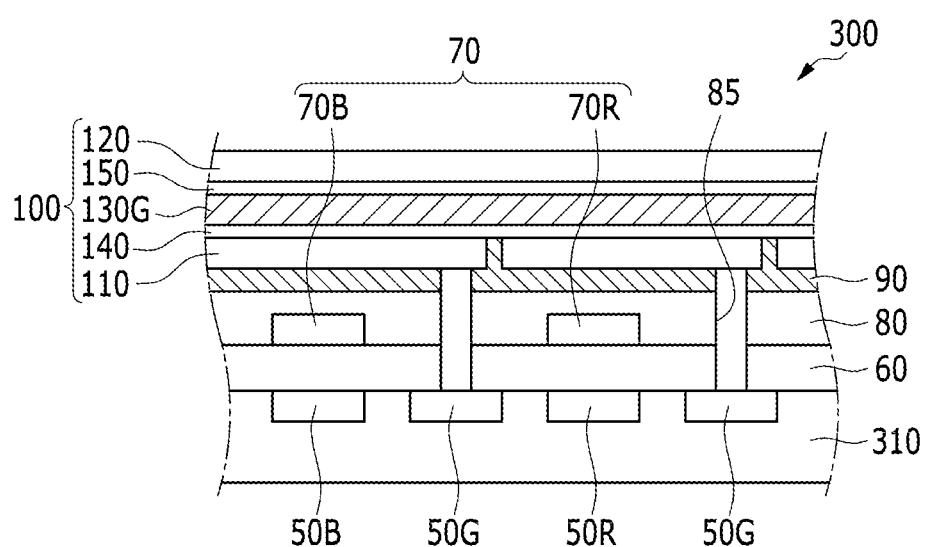
FIG. 3 is a cross-sectional view showing a CMOS image sensor according to example embodiments.

FIG. 3 is a cross-sectional view showing an organic photoelectronic device according to example embodiments.

Referring to FIG. 3, a CMOS image sensor 300 according to example embodiments includes a semiconductor substrate 310 integrated with a blue photo-sensing device 50B, a red photo-sensing device 50R, a charge storage device 50G, and a transmission transistor (not shown), a lower insulation layer 60, a color filter layer 70, an upper insulation layer 80, and a green photo-sensing device 100, like the example embodiments illustrated in FIG. 2.

The color filter layer 70 includes a blue color filter 70B of a blue pixel and a red color filter 70R of a red pixel, and the green photo-sensing device 100 includes a lower electrode 110, a photoactive layer 130G, and an upper electrode 120. The photoactive layer 130G may selectively absorb light in a green wavelength region and transmit light in other wavelength region besides the green wavelength region, that is, light in a blue wavelength region and a red wavelength region, as described above.

However, the green photo-sensing device 100 further includes charge auxiliary layers 140 and 150 between the lower electrode 110 and the photoactive layer 130G and between the upper electrode 120 and the photoactive layer 130G, unlike the example embodiments illustrated in FIG. 2. Either one of the charge auxiliary layers 140 and 150 may be omitted.

The charge auxiliary layers 140 and 150 may be at least one selected from a hole injection layer (HIL) for facilitating hole injection, a hole transport layer (HTL) for facilitating hole transport, an electron blocking layer (EBL) for preventing or inhibiting electron transport, an electron injection layer (EIL) for facilitating electron injection, an electron transport layer (ETL) for facilitating electron transport, and a hole blocking layer (HBL) for preventing or inhibiting hole transport.

The charge auxiliary layers 140 and 150 may include, for example, an organic material, an inorganic material, or an organic/inorganic material. The organic material may include an organic compound having hole or electron characteristics, and the inorganic material may be, for example, a metal oxide (e.g., molybdenum oxide, tungsten oxide and/or nickel oxide).

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto. The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Figure 4:
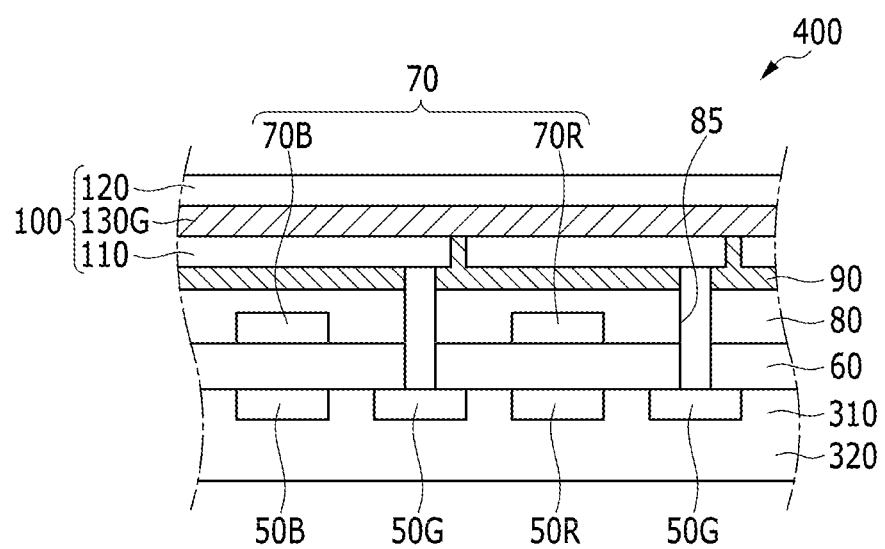
FIG. 4 is a cross-sectional view showing a CMOS image sensor according to example embodiments.

FIG. 4 is a cross-sectional view of an organic CMOS image sensor according to example embodiments.

The CMOS image sensor 400 according to example embodiments includes a semiconductor substrate 310 integrated with a blue photo-sensing device 50B, a red photo-sensing device 50R, a charge storage device 50G, and a transmission transistor, a lower insulation layer 60, a color filter layer 70, a upper insulation layer 80, and a green photo-sensing device 100, like the example embodiments illustrated in FIG. 3.

The color filter layer 70 includes a blue color filter 70B of a blue pixel and a red color filter 70R of a red pixel, and the green photo-sensing device 100 includes a lower electrode 110, a photoactive layer 130G, and an upper electrode 120. The photoactive layer 130G may selectively absorb light in a green wavelength region, and transmit light in other wavelength region besides the green wavelength region, that is, light in a blue wavelength region and a red wavelength region, as described above.

However, the organic photoelectronic device 300 according to example embodiments further include a semi-transmitting layer 90 between the green photo-sensing device 100 and the color filter layer 70, unlike the example embodiments illustrated in FIG. 3.

The semi-transmitting layer 90 may transmit a part of light and reflect a part of light, and for example, selectively transmit light in the blue wavelength region and the red wavelength region and selectively reflect light in the green wavelength region.

The semi-transmitting layer 90 may reflect light in the green wavelength region that is not absorbed in the photoactive layer 130G, to the photoactive layer 130G again, and thus improves a light absorption rate in a green wavelength region of the photoactive layer 130G. Therefore, efficiency of the green photo-sensing device 100 may be improved.

The semi-transmitting layer 90 may have, for example, a distributed Bragg reflection (DBR) structure.

Figure 5:
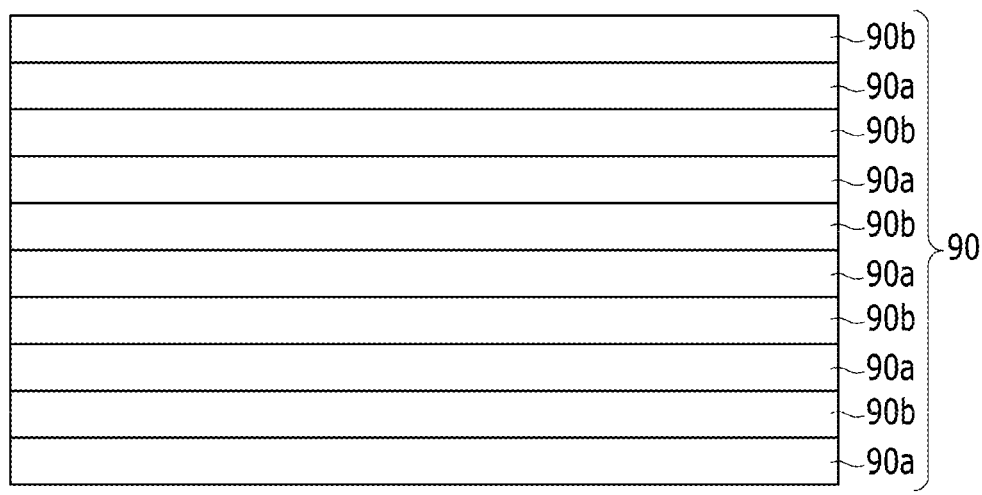
FIG. 5 is a cross-sectional view showing a semi-transmitting layer in the image sensor of FIG. 4.

FIG. 5 is a cross-sectional view showing an example of a semi-transmitting layer in the image sensor of FIG. 4.

Referring to FIG. 5, the semi-transmitting layer 90 may include a plurality of layers where a first layer 90a and a second layer 90b having a different refractive index from each other are alternately stacked on the semiconductor substrate 310, and may include, for example, 5 to 10 layers.

The first layer 90a may be a low refractive index layer, and the second layer 90b may be a high refractive index layer. For example, the first layer 90a may have a refractive index of about 1.2 to about 1.8, and the second layer 90b may have a refractive index of about 2.1 to about 2.7. Within the range, the first layer 90a may have may have a refractive index of about 1.44 to about 1.47, and the second layer 90b may have a refractive index of about 2.31 to about 2.45. The first layer 90a and the second layer 90b may include any material having the refractive index without particular limitation, and for example, the first layer may be a silicon oxide layer, and the second layer may be a titanium oxide layer. Within the ranges, a ratio of refractive indices of the first layer and the second layer may be controlled easily in order to increase selectivity for absorbing light in a green wavelength.

The thicknesses of the first layer 90a and the second layer 90b may be determined by each refractive index and reflective wavelength of each layer, and for example, each first layer 90a may have a thickness of about 10 nm to about 300 nm, and each second layer 90b may have a thickness of about 30 nm to about 200 nm. The semi-transmitting layer 90 may have a total thickness of, for example, about 770 nm to about 1540 nm. The thicknesses of each first layer 90a and each second layer 90b may be the same or different.

As a refractive index $n_1$ of the first layer 90a and a refractive index $n_2$ of the second layer 90b have a larger difference from each other, the semi-transmitting layer 90 may have higher wavelength selectivity, and for example, a ratio between the refractive index $n_1$ of the first layer 90a and the refractive index $n_2$ of the second layer 90b may determine a full width at half maximum (FWHM) of the third wavelength region in a light-absorption spectrum. Herein, the full width at half maximum indicates width of a wavelength corresponding to a half of the maximum absorbance point, and thus a small full width at half maximum indicates selective absorption of light in a narrow wavelength region and high wavelength selectivity. In other words, as the ratio between the refractive index $n_1$ of the first layer 90a and the refractive index $n_2$ of the second layer 90b, that is, a ratio of $n_2/n_1$, becomes larger, the full width at half maximum becomes narrower, increasing wavelength selectivity.

Figure 6:
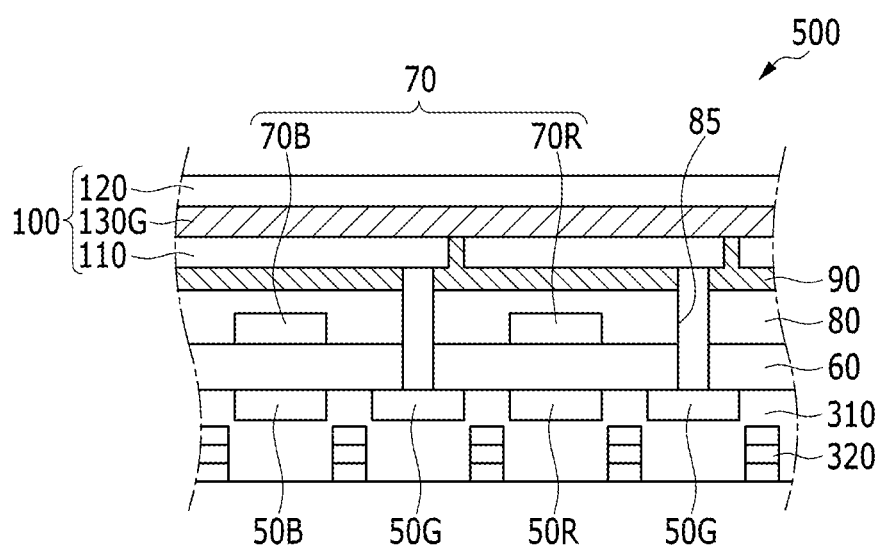
FIG. 6 is a cross-sectional view showing a CMOS image sensor according to example embodiments.

FIG. 6 is a cross-sectional view showing a CMOS image sensor according to example embodiments.

Referring to FIG. 6, a CMOS image sensor 500 according to example embodiments includes a semiconductor substrate 310 integrated with a blue photo-sensing device 50B, a red photo-sensing device 50R, a charge storage device 50G, and a transmission transistor (not shown), a lower insulation layer 60, a color filter layer 70, a upper insulation layer 80, a semi-transmitting layer 90, and a green photo-sensing device 100, like example embodiments as illustrated in FIG. 4.

The color filter layer 70 includes a blue color filter 70B of a blue pixel and a red color filter 70R of a red pixel, and the green photo-sensing device 100 includes a lower electrode 110, a photoactive layer 130G, and an upper electrode 120. The photoactive layer 130G may selectively absorb light in a green wavelength region and transmit light in other wavelength region besides the green wavelength region, that is, light in a blue wavelength region and a red wavelength region, as described above.

However, a metal wire 320 is positioned beneath the blue photo-sensing device 50B, the red photo-sensing device 50R, and the charge storage device 50G, unlike the example embodiments of FIG. 4. When the metal wire 320 is positioned beneath the blue photo-sensing device 50B, the red photo-sensing device 50R, and the charge storage device 50G, light loss due to reflection of the metal wire 320 made of an opaque metal decreases, light efficiency increases, and light interference among pixels may be effectively reduced.

Figure 7:
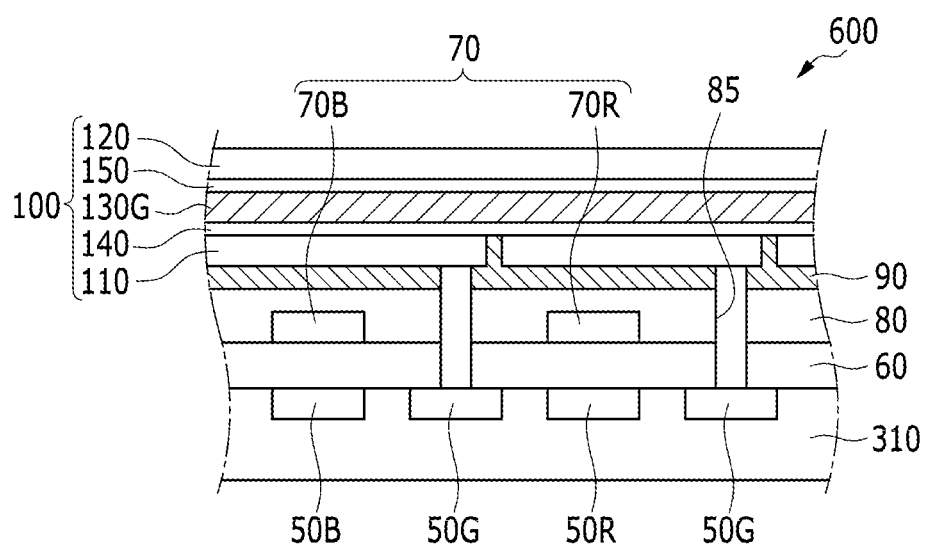
FIG. 7 is a cross-sectional view showing a CMOS image sensor according to example embodiments.

FIG. 7 is a cross-sectional view showing a CMOS image sensor according to example embodiments.

Referring to FIG. 7, a CMOS image sensor 600 according to example embodiments includes a semiconductor substrate 310 integrated with a blue photo-sensing device 50B, a red photo-sensing device 50R, a charge storage device 50G, and a transmission transistor (not shown), a lower insulation layer 60, a color filter layer 70, a upper insulation layer 80, a semi-transmitting layer 90, and a green photo-sensing device 100, like the example embodiments of FIG. 4.

The color filter layer 70 includes a blue color filter 70B of a blue pixel and a red color filter 70R of a red pixel, and the green photo-sensing device 100 includes a lower electrode 110, a photoactive layer 130G, and an upper electrode 120. The photoactive layer 130G may selectively absorb light in a green wavelength region and transmit light in other wavelength region besides the green wavelength region, that is, light in a blue wavelength region and a red wavelength region, as described above.

However, the green photo-sensing device 100 further includes charge auxiliary layer 140 and 150 between the lower electrode 110 and the photoactive layer 130G and between the upper electrode 120 and the photoactive layer 130G, and further includes a semi-transmitting layer 90 between the green photo-sensing device 100 and the color filter layer 70, unlike the example embodiments of FIG. 4. The charge auxiliary layer 140 and 150 and the semi-transmitting layer 90 are described above.

The image sensor according to example embodiments may improve absorption efficiency in all wavelength regions of the blue wavelength region, red wavelength region, and green wavelength region, and thus sensitivity of an image sensor may be improved and performance of an electronic device including the image sensor may be improved.

The electronic device may be, for example a mobile phone or a digital camera, but is not limited thereto.

Hereinafter, the present disclosure is illustrated in more detail with reference to examples. However, these are examples, and the present disclosure is not limited thereto.

Manufacture of Image Sensor

Example 1

An anode is manufactured by forming a color filter layer including red and blue color filters on a Si CMOS semiconductor substrate, sputtering ITO thereon to be about 100 nm thick, and co-depositing a molybdenum oxide ($MoO_x$) and Al thereon to form a 5 nm-thick charge auxiliary layer. Subsequently, a 70 nm-thick photoactive layer is formed with a p-type semiconductor material (LT-E503, Lumtec) represented by co-depositing the Chemical Formula A and an n-type semiconductor material represented by the Chemical Formula B in a thickness ratio of 1:1 on the molybdenum oxide and Al thin film ($MoO_x$:Al). Subsequently, an 80 nm-thick cathode is formed by chemically depositing ITO on the photoactive layer, manufacturing a CMOS image sensor.

[Chemical Formula A]

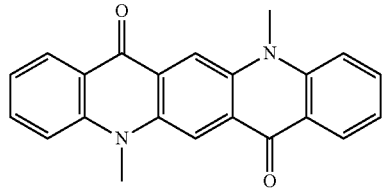

[Chemical Formula B]

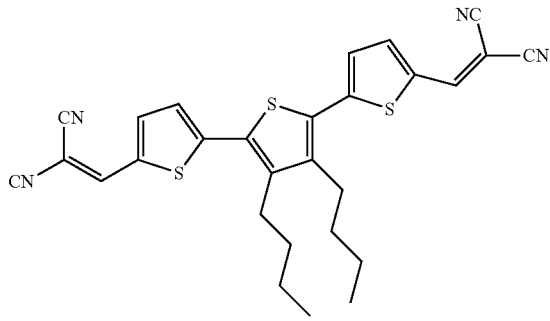

Example 2

A CMOS image sensor is manufactured according to the same method as Example 1, except for further forming a semi-transmitting layer by stacking a silicon oxide layer having a refractive index of 1.4599 and a titanium oxide layer having a refractive index of 2.4236 in plural between the color filter layer and the ITO anode.

The silicon oxide layer and the titanium oxide layer are alternately and repeatedly stacked in 8 layers, and each layer has a thickness provided in the following Table 1.

TABLE 1

| First layer | Silicon oxide layer | 200 nm |
| | Titanium oxide layer | 163 nm |
| Second layer | Silicon oxide layer | 37 nm |
| | Titanium oxide layer | 91 nm |
| Third layer | Silicon oxide layer | 49 nm |
| | Titanium oxide layer | 88 nm |
| Fourth layer | Silicon oxide layer | 40 nm |
| | Titanium oxide layer | 85 nm |

TABLE 1-continued

| | | |
|---|---|---|
| Fifth layer | Silicon oxide layer | 17 nm |
| | Titanium oxide layer | 82 nm |
| Sixth layer | Silicon oxide layer | 88 nm |
| | Titanium oxide layer | 91 nm |
| Seventh layer | Silicon oxide layer | 25 nm |
| | Titanium oxide layer | 69 nm |
| Eighth layer | Silicon oxide layer | 17 nm |
| | Titanium oxide layer | 97 nm |
| Total thickness | | 1239 nm |

Evaluation

Sensitivity and photoelectric conversion efficiency of the image sensors according to Examples 1 and 2 are evaluated.

The sensitivity is evaluated by measuring an electron generation speed depending on each particular light to obtain a linear graph, while the particular light is radiated on the image sensors for a predetermined or given time, and then calculating the slope of the graph with Tsubosaka Electric LSBD-111/4 and Kyoritsu LB-8601.

The photoelectric conversion efficiency is evaluated by using an IPCE measurement system (McScience Inc., Korea). First, the photoelectric conversion efficiency is measured in a wavelength range of about 350 nm to 750 nm by calibrating the equipment with using a Si photodiode (Hamamatsu Photonics K. K. Japan), and then mounting the equipment on the CMOS image sensors according to Examples 1 and 2.

The results are provided in Table 2.

TABLE 2

| | Sensitivity (mV/lux · s) | Photoelectric conversion efficiency (%) |
|---|---|---|
| Example 1 | 250 | 40 |
| Example 2 | 343 | 55 |

Referring to Table 2, the image sensors according to Examples 1 and 2 show sensitivity of greater than or equal to about 250 mV/lux·s and photoelectric conversion efficiency of greater than or equal to 40%, and thus have satisfactory performance, and in particular, the semi-transmitting layer according to Example 2 shows improved sensitivity and photoelectric conversion efficiency.

While this disclosure has been described in connection with what is presently considered to be practical example embodiments, it is to be understood that the inventive concepts are not limited to the disclosed embodiments, but, on the contrary, the disclosure is intended to cover various modifications and equivalent arrangements included within the spirit and scope of the appended claims.

What is claimed is:

1. An image sensor, comprising:
   a semiconductor substrate integrated with at least one first photo-sensing device configured to sense light in a blue wavelength region and at least one second photo-sensing device configured to sense light in a red wavelength region;
   a color filter layer on the semiconductor substrate, the color filter layer including a blue color filter configured to selectively absorb light in the blue wavelength region and a red color filter configured to selectively absorb light in the red wavelength region; and
   a third photo-sensing device on the color filter layer, the third photo-sensing device including,
   a pair of electrodes facing each other,
   a photoactive layer between the pair of electrodes, the photoactive layer configured to selectively absorb light in a green wavelength region, and
   a charge auxiliary layer between the photoactive layer and one electrode of the pair of electrodes, the charge auxiliary layer configured to
   facilitate hole injection or facilitate electron injection,
   facilitate hole transport or inhibit hole transport, and/or
   facilitate electron transport or inhibit electron transport.

2. The image sensor of claim 1, further comprising:
   a pair of charge auxiliary layers between the pair of electrodes, the pair of charge auxiliary layers on opposite sides of the photoactive layer, each layer of the pair of charge auxiliary layers configured to
   facilitate hole injection or facilitate electron injection,
   facilitate hole transport or inhibit hole transport, and/or
   facilitate electron transport or inhibit electron transport.

3. The image sensor of claim 1, wherein the charge auxiliary layer includes an organic material, an inorganic material, or an organic/inorganic material.

4. The image sensor of claim 3, wherein,
   the charge auxiliary layer includes the organic material, and
   the organic material includes an organic compound having hole or electron characteristics.

5. The image sensor of claim 3, wherein,
   the charge auxiliary layer includes the inorganic material, and
   the inorganic material includes a metal oxide material.

6. The image sensor of claim 5, wherein the inorganic material includes at least one metal oxide material of molybdenum oxide, tungsten oxide, and nickel oxide.

7. The image sensor of claim 6, wherein the inorganic material includes molybdenum oxide and aluminum.

8. The image sensor of claim 1, wherein,
   the charge auxiliary layer is configured to facilitate hole transport, and
   the charge auxiliary layer includes at least one material of
   poly(3,4-ethylenedioxythiophene):poly(styrenesulfonate) (PEDOT:PSS),
   polyarylamine,
   poly(N-vinylcarbazole),
   polyaniline,
   polypyrrole,
   N,N,N',N'-tetrakis(4-methoxyphenyl)-benzidine (TPD),
   4-bis[N-(1-naphthyl)-N-phenyl-amino]biphenyl (α-NPD),
   m-MTDATA, and
   4,4',4"-tris(N-carbazolyl)-triphenylamine (TCTA).

9. The image sensor of claim 1, wherein,
   the charge auxiliary layer is configured to inhibit hole transport, and
   the charge auxiliary layer includes at least one material of
   1,4,5,8-naphthalene-tetracarboxylic dianhydride (NTCDA),
   bathocuproine (BCP),
   LiF,
   $Alq_3$,
   $Gaq_3$,
   $Inq_3$,
   $Znq_2$,
   $Zn(BTZ)_2$, and
   $BeBq_2$.

10. The image sensor of claim 1, wherein,
    the charge auxiliary layer is configured to inhibit electron transport, and the charge auxiliary layer includes at least one material of
poly(3,4-ethylenedioxythiophene):poly(styrenesulfonate) (PEDOT:PSS),
polyarylamine,
poly(N-vinylcarbazole),
polyaniline,
polypyrrole,
N,N,N',N'-tetrakis(4-methoxyphenyl)-benzidine (TPD),
4-bis[N-(1-naphthyl)-N-phenyl-amino]biphenyl (α-NPD), and
m-MTDATA, 4,4',4"-tris(N-carbazolyl)-triphenylamine (TCTA).

11. The image sensor of claim 1, wherein,
the charge auxiliary layer is configured to facilitate electron transport, and
the charge auxiliary layer includes at least one material of
1,4,5,8-naphthalene-tetracarboxylic dianhydride (NTCDA),
bathocuproine (BCP),
LiF,
$Alq_3$,
$Gaq_3$,
$Inq_3$,
$Znq_2$,
$Zn(BTZ)_2$, and
$BeBq_2$.

12. The image sensor of claim 1, wherein,
the blue wavelength region has a maximum absorption wavelength ($\lambda_{max}$) in a region of greater than or equal to about 400 nm and less than about 500 nm,
the red wavelength region has a maximum absorption wavelength ($\lambda_{max}$) in a region of greater than about 580 nm and less than or equal to about 700 nm, and
the green wavelength region has a maximum absorption wavelength ($\lambda_{max}$) in a region of about 500 nm to about 580 nm.

13. The image sensor of claim 1, wherein
the pair of electrodes are light-transmitting electrodes, and
the photoactive layer includes a p-type semiconductor material and an n-type semiconductor material, at least one of the p-type semiconductor material and the n-type semiconductor material configured to selectively absorb light in the green wavelength region.

14. The image sensor of claim 13, wherein the p-type semiconductor material and the n-type semiconductor material form a pn junction.

15. The image sensor of claim 14, wherein
the light-transmitting electrodes include one of a transparent conductor layer, a metal layer, and a metal layer doped with a metal oxide,
the p-type semiconductor material includes one of quinacridone and a derivative thereof, and
the n-type semiconductor material includes a cyanovinyl group-containing thiophene derivative.

16. The image sensor of claim 1, further comprising:
a focusing lens on the third photo-sensing device.

17. The image sensor of claim 1, further comprising:
a metal wire beneath the at least one first photo-sensing device and the at least one second photo-sensing device.

18. The image sensor of claim 17, wherein the metal wire includes one of aluminum (Al), copper (Cu), silver (Ag), and alloys thereof.

19. An electronic device comprising the image sensor of claim 1.

20. The electronic device of claim 19, wherein the electronic device is one of a mobile phone and a digital camera.

21. The image sensor of claim 1, wherein the semiconductor substrate further comprises a charge storage device.

* * * * *